United States Patent
Iyer et al.

(10) Patent No.: US 11,303,110 B1
(45) Date of Patent: Apr. 12, 2022

(54) SYSTEM AND METHODS FOR USING THYRISTORS TO CONDUCT SURGE CURRENTS AWAY FROM CRITICAL INFRASTRUCTURE

(71) Applicant: Smart Wires Inc., Union City, CA (US)

(72) Inventors: Amrit Iyer, Oakland, CA (US); Govind Chavan, Union City, CA (US); Liyu Cao, Fremont, CA (US); Brock Petersen, Oakland, CA (US); Haroon Inam, San Jose, CA (US); Antonio Ginart, Santa Clarita, CA (US)

(73) Assignee: Smart Wires Inc., Union City, CA (US)

(*) Notice: Subject to any disclaimer, the term of this patent is extended or adjusted under 35 U.S.C. 154(b) by 13 days.

(21) Appl. No.: 16/922,882

(22) Filed: Jul. 7, 2020

Related U.S. Application Data

(60) Provisional application No. 62/878,597, filed on Jul. 25, 2019.

(51) Int. Cl.
| | | |
|---|---|---|
| *H02H 7/26* | (2006.01) | |
| *H02H 1/00* | (2006.01) | |
| *H03K 19/0175* | (2006.01) | |
| *H03K 17/72* | (2006.01) | |

(52) U.S. Cl.
CPC ............ *H02H 7/26* (2013.01); *H02H 1/0007* (2013.01); *H02H 1/0092* (2013.01); *H03K 17/72* (2013.01); *H03K 19/017509* (2013.01)

(58) Field of Classification Search
CPC ...... H02H 7/26; H02H 1/0007; H02H 1/0092; H03K 17/72; H03K 19/017509
USPC .......................................................... 361/100
See application file for complete search history.

(56) References Cited

U.S. PATENT DOCUMENTS

| | | | |
|---|---|---|---|
| 6,075,349 A | * | 6/2000 | Okayama .............. H02J 3/1814 323/207 |
| 8,164,876 B2 | | 4/2012 | Simi |
| 9,190,829 B2 | | 11/2015 | Miller |
| 2013/0329323 A1 | | 12/2013 | Wang et al. |
| 2017/0288393 A1 | | 10/2017 | Kudou et al. |

\* cited by examiner

*Primary Examiner* — Tomi Skibinski
(74) *Attorney, Agent, or Firm* — Womble Bond Dickinson (US) LLP

(57) ABSTRACT

A system and method using thyristors to protect a series-connected Flexible AC Transmission Systems (FACTS) device from surge currents are disclosed. According to some embodiments, the system includes a thyristor connected in shunt with the FACTS device to be protected. The system further includes control circuitry coupled to the thyristor to drive a gate of the thyristor with a direct current (DC) signal and turn on the thyristor in a time span on order of microseconds. The system and method can be used to protect any series-connected FACTS device that is in danger of being exposed to surge current such as a reclose after a deadline.

19 Claims, 7 Drawing Sheets

SYSTEM AND METHODS FOR USING THYRISTORS TO CONDUCT SURGE CURRENTS AWAY FROM CRITICAL INFRASTRUCTURE

CROSS-REFERENCE TO RELATED APPLICATIONS

This application claims the benefit of priority from U.S. Provisional Application No. 62/878,597, filed on Jul. 25, 2019, the disclosure of which is incorporated herein by reference in its entirety.

TECHNICAL FIELD

The present disclosure relates to systems and methods for Flexible AC Transmission Systems (FACTS) and specifically relates to fault current protection of series-connected FACTS devices.

BACKGROUND

There is an emphasis on better utilization of available AC transmission infrastructure due to the socio-economic problems, such as environmental clearance, the right of way, large capital investments, in laying and commissioning of new transmission lines. FACTS devices can provide reactive power compensation, improve transmission efficiency, and enhance voltage and stability of AC transmission systems. FACTS devices provide more granular and faster control than electro-mechanical devices such as phase-shifting transformers and thus have become critical for improving the efficiencies of the power grid. FACTS devices are highly complex semiconductor-based devices that operate in either series or shunt modes. FACTS devices require long planning cycles and careful design before installation.

Most FACT devices are custom-built and have a unique design for fault handling. Fault handling strategy of FACTS devices is a deterrent to the large-scale adoption of these devices. During a typical fault on AC transmission lines, very high currents appear on the lines. Fault conditions can be transitory or can appear for extended periods. Electronic components in the FACTS devices need to be protected by fault protection circuitry as they can fail due to the very high fault currents which is in the order of thousands of Amperes. Fault protection circuitry includes fast-acting and robust switches such as SCRs (silicon-controlled rectifiers) or electro-mechanical switches. The protection circuitry may also include metal oxide varistors (MOVs) to shunt excessive currents. An MOV's resistance varies with the applied voltages and provides a very high resistance when triggered.

Referring to FIG. 1 which shows a prior art implementation of FACTS devices 130 based power grid system 100. As shown in the figure, system 100 includes a generator 101 and transformer 110-01 for stepping up the voltage for transmission over the transmission line 105. The circuit breaker (CB)/auto recloser (AR) 120-01 isolates the generator 101 and transformer 110-01 from the transmission line 105 and protects them in case of a fault. The circuit breaker/auto recloser 120-02 isolates the power grid from the rest of the system (110-02, 102, etc.). The FACTS device 130-01 is connected in shunt whereas the FACTS device 130-02 is connected in series. Examples of series-connected FACTS device 130-01 include Static Synchronous Series Compensator (SSSC), Thyristor Controlled Series Compensators (TCSC) etc. Examples of shunt connected FACTS device 130-01 include Static Synchronous Compensator (STATCOM), Static VAR Compensators (SVC), etc. Some FACTS devices such as Unified Power Flow Controller (UPFC) are connected in both series and shunt. During regular operation, the FACTS devices 130-01 and 130-02 are used to improve the power factor and improve the efficiency of the transmission. In case of a fault, the CB/AR 120-01 is opened to protect the system 100. The CB/AR 120-01 is closed multiple times to see if the fault has cleared. During the reclose attempts the FACTS devices 130-01 and 130-02 need to withstand the surge currents that are generated by closing of CB/AR 120-01.

Fuses are commonly used to protect FACTs device 130-01 but have the downside that the device loses power when the fault is over. The other commonly used method to protect the device is to rate the device itself to handle the surge current. Referring to FIG. 2, which is a prior art example of the series capacitive compensation used to improve the power factor of the power lines. The protection circuit associated with the capacitor 202 in series with the transmission line 105 includes a MOV bank 203, a triggered gap 205 with a current limiting inductor 205 in series, and a bypass breaker 206. The inductor 205 limits the current through the gap 205.

Referring to FIG. 3, which is a prior art example of a single TCSC unit. The TCSC 307 includes a bypass switch 306, and in combination with the inductor 'L' 305 in parallel with the capacitor 'C' 304 is able to inject both capacitive or inductive impedances on the transmission line 105. The control block 308 is used to control the firing angle and duration of TCSC 307. The control block 308 includes an MCU (micro controller unit) and a communication module for coordination etc. The protection circuitry includes the MOV 203 stack, the triggered air/vacuum gap 205, and the bypass breaker 206. The triggered air gap 205 and the bypass breaker 206 have the damping circuit 204 to reduce oscillations and provide a current limit. In addition to the fault current protection, FIG. 3 also shows the circuit breakers 303 A and 303 B which allow the TCSC module to be disconnected from the line 105 and a re-closer breaker 120 for reconnecting the TCSC when fault is repaired.

The protection circuitry (MOV 203, triggered gap 205, etc.) add complexity and contribute to added costs (manufacturing, installation and operating) to the FACTS devices 130. In case of fault, CB/AR 120-01 is opened and subsequently reclosed to see if the fault has cleared on its own. There will be a surge fault current if the fault has not been cleared. This reclosing of CB/AR 120-01 can happen multiple times. The protection circuitry must protect the FACTS devices during these auto-reclosures and adds to the complexity and costs. There is a need for better protection scheme that can reduce the complexity and costs for FACTs devices.

SUMMARY

In one embodiment, a system is to protect series-connected Flexible AC Transmission Systems (FACTS) devices. The system includes a thyristor. The thyristor is connected in shunt with the FACTS device to be protected. There is control circuitry coupled to the thyristor. The control circuitry is to drive a gate of the thyristor with a direct current (DC) signal. This turns on the thyristor in a time span on the order of microseconds.

In one embodiment, a method is to protect a series-connected Flexible AC Transmission Systems (FACTS) device. A system determines a surge current is imminent in an alternating current (AC) transmission line in a power grid. The system drives a gate of a thyristor that is connected in shunt with a FACTS device. The FACTS device is connected to the AC transmission line and is to be protected. The system drives the gate with a direct current (DC) signal to turn on the thyristor in a time span on the order of microseconds.

In one embodiment, a method is to drive a gate of a thyristor, to protect a series-connected Flexible AC Transmission Systems (FACTS) device. The system determines the series-connected FACTS device is to be protected from a surge current on an alternating current (AC) transmission line in a power grid. The system drives a gate of a thyristor. The thyristor is connected in shunt with the FACTS device. The system drives the gate with peak current pulses. Driving the gate activates the thyristor in a time span on the order of microseconds.

Other aspects of the embodiments will become apparent from the following detailed description taken in conjunction with the accompanying drawings which illustrate, by way of example, the principles of the described embodiments.

BRIEF DESCRIPTION OF THE DRAWINGS

The drawings are made to point out and distinguish embodiments of the invention from the prior art. The objects, features and advantages of the embodiments the invention are detailed in the description taken together with the drawings.

DETAILED DESCRIPTION

A system and method using thyristors to protect series-connected device from surge currents are disclosed. The system and method can be used to protect any series-connected device that is in danger of being exposed to surge current such as a reclose after a deadline.

Figure 1:
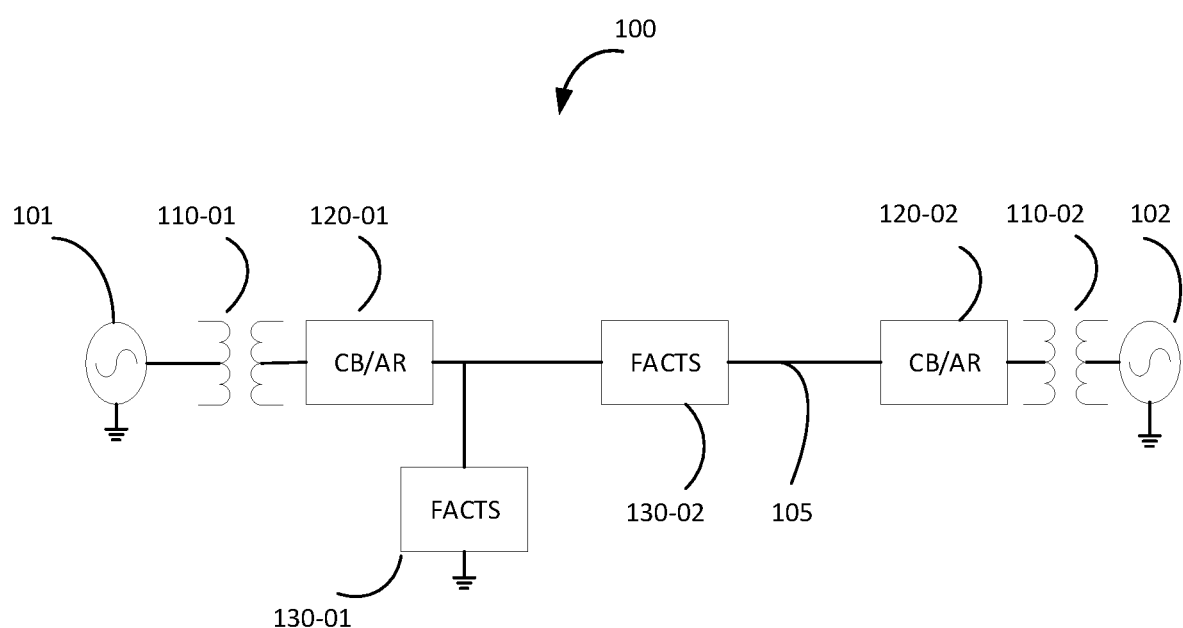
FIG. 1 is a prior art system block diagram 100 of FACTS devices with circuit breaker and auto recloser protections as part of the power grid system.
Figure 2:
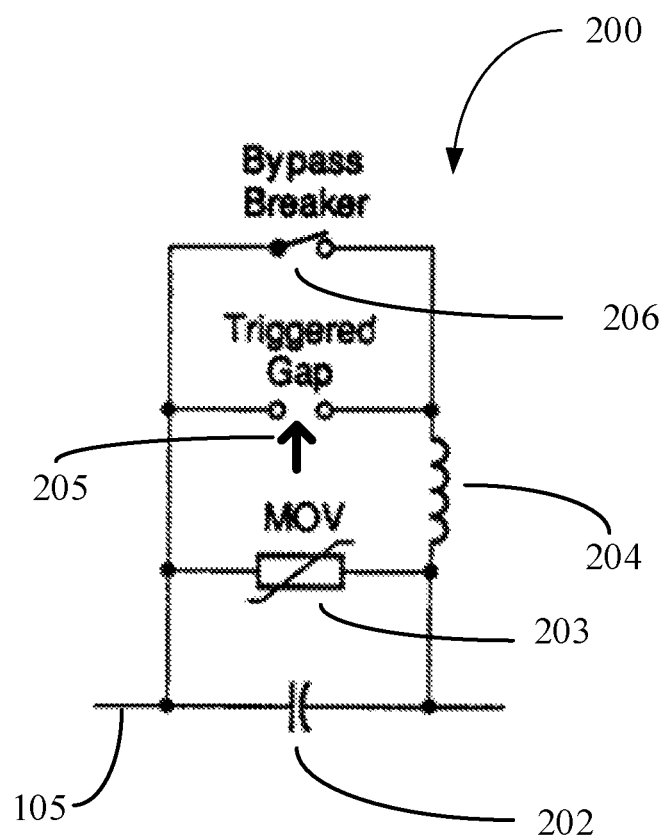
FIG. 2 is a prior art block diagram 200 of a series capacitor bank including the fault current protection components.
Figure 3:
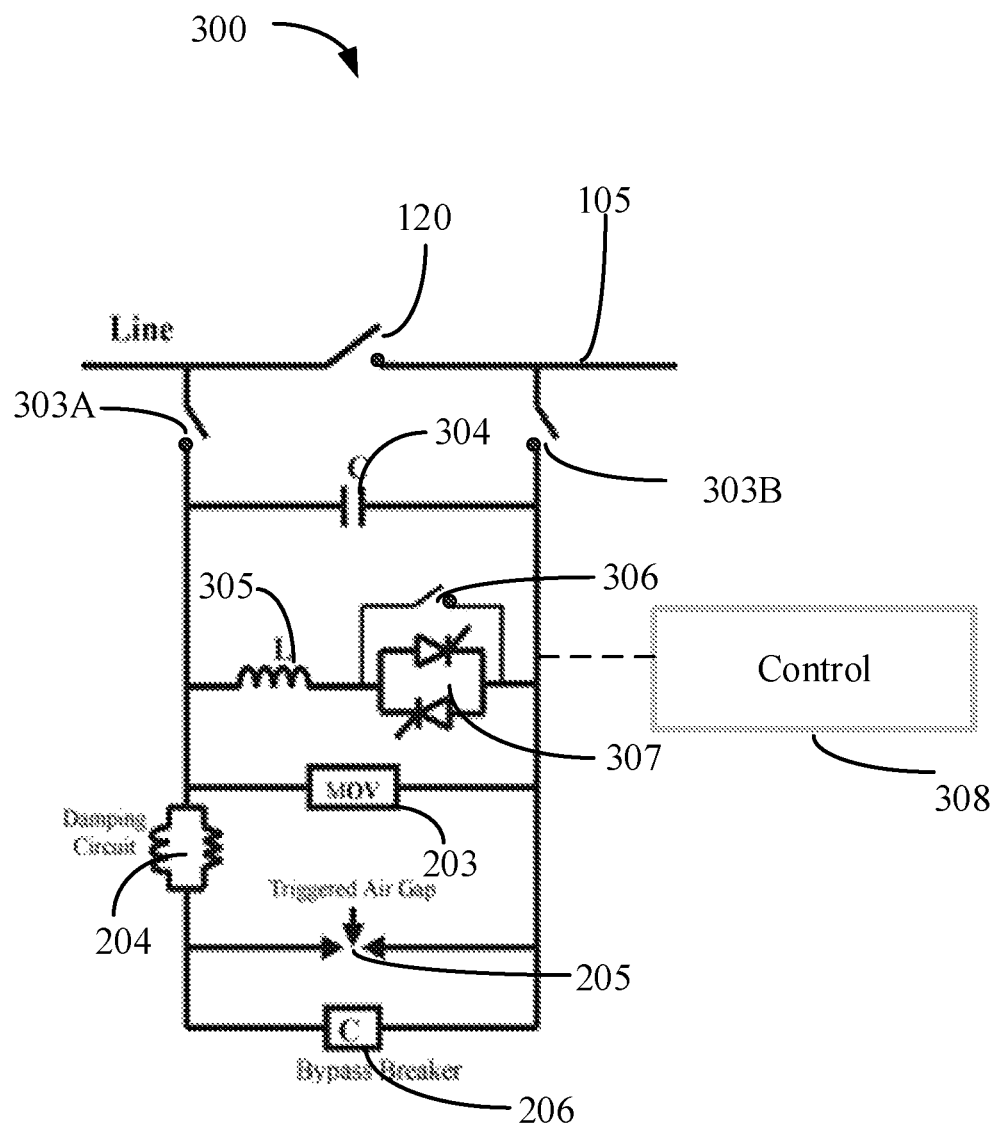
FIG. 3 is an exemplary prior art block diagram 300 showing the internal components including fault protection components of the FACTS device of FIG. 1.
Figure 4:
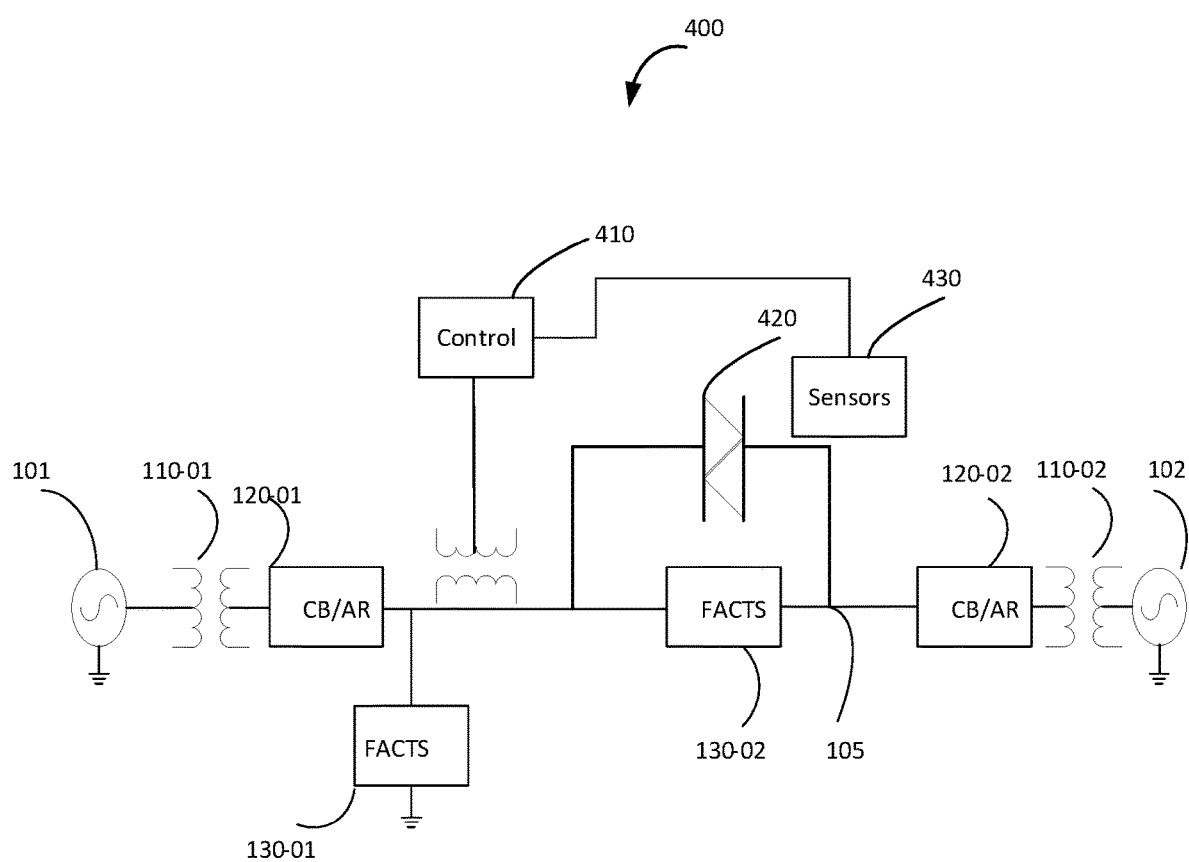
FIG. 4 is an example block diagram of system 400 showing a thyristor-based surge current protection of a series-connected FACTS device according to one embodiment.

FIG. 4 shows an example block diagram of system 400 illustrating a thyristor-based surge current protection for series-connected FACTS device. The system shown in FIG. 4 can be similar to system 100 shown in FIG. 1 with the difference being that the protection from surge current is provided by thyristor 420. In some embodiments, thyristor and SCR are used interchangeably. In some embodiments, the SCR can be anti-parallel SCRs configured to carry current and block voltage in both directions. The thyristor-based protection augments the MOV, airgap, etc. and significantly reduces size of the MOV. As shown in FIG. 4, FACTS device 130-02 is protected by thyristor 420. The thyristor 420 is controlled by control block 410.

Typically, thyristors are turned on by driving the gate with a pulse train signal. In one embodiment, the gate of the thyristor 420 is controlled by a DC signal with a specific waveform. The control block 410 determines that there is a deadline followed by a reclose that needs to fire the thyristor 420 very quickly (on the order of microseconds) and this is achieved by driving the gate of thyristor 420 with peak current pulses. This turns the thyristor 420 on and allows thyristor 420 to shunt away the surge current and protect the FACTS device 130-02. In one embodiment, the control block 410 drives the gate of thyristor 420 with sufficient gate current to keep it turned on. Sensors 430 may be used to determine the temperature and anode to cathode currents of the thyristor 420, which in turn are used to determine the appropriate voltage and current levels to be driven into the gate of thyristor 420.

Figure 6:
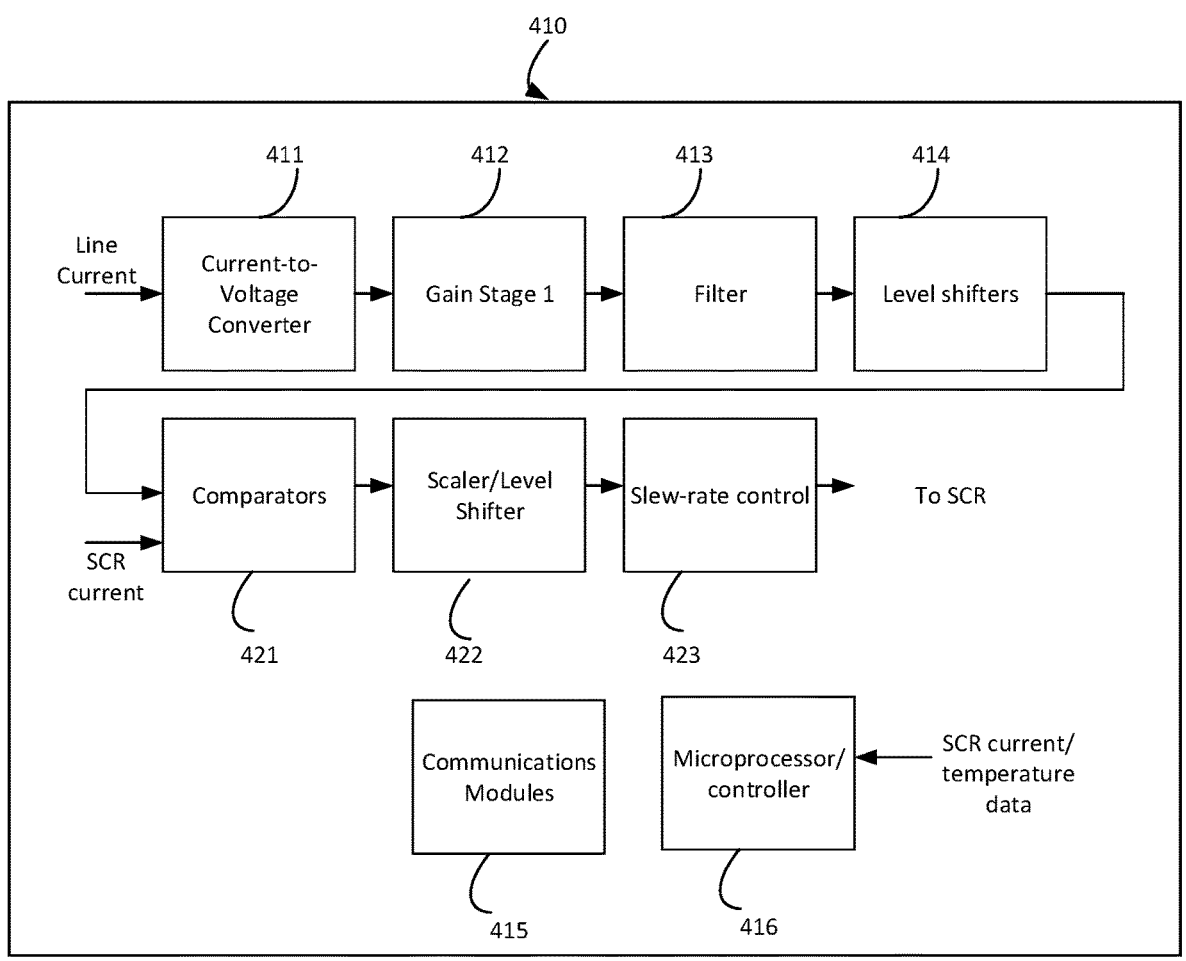
FIG. 6 is an example block diagram of control block 410 of system 400

FIG. 6 shows an example block diagram representation of control block 410 shown in FIG. 4. In FIG. 6, communication modules 415 along with controller (or microprocessor) 416 are used to determine that there is a surge current introduced after a line energization, a deadline followed by a reclose, or the event of a fault occurring during normal operation. The line current is driven into current-to-voltage converter 411 which in turn is driven into gain stage 412 (also referred to as gain stage 1), which is used to scale the current. Multiple gain stage 412 blocks may be used to achieve the required current scaling (though not explicitly shown in FIG. 6). In one embodiment, filter 413 is used to filter out any unwanted noise and smooth out the current pulse. The filter 413 output may be level shifted by level shifters 414 and continuously adjusted using the comparators 421, scaler/level shifter 422 and slew-rate control 423 before being driven into the gate of SCR or thyristor 420. In one embodiment, controller/microprocessor 416 is used to control the various circuits and also provides various timer functions. Controller/microprocessor 416 can be implemented using discrete components, FPGAs, ASICs, etc. In some embodiments, the circuits for various blocks shown in FIG. 6 are commonplace and readily devised.

Embodiments of the invention may be described as a process, which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, etc.

Figure 5A:
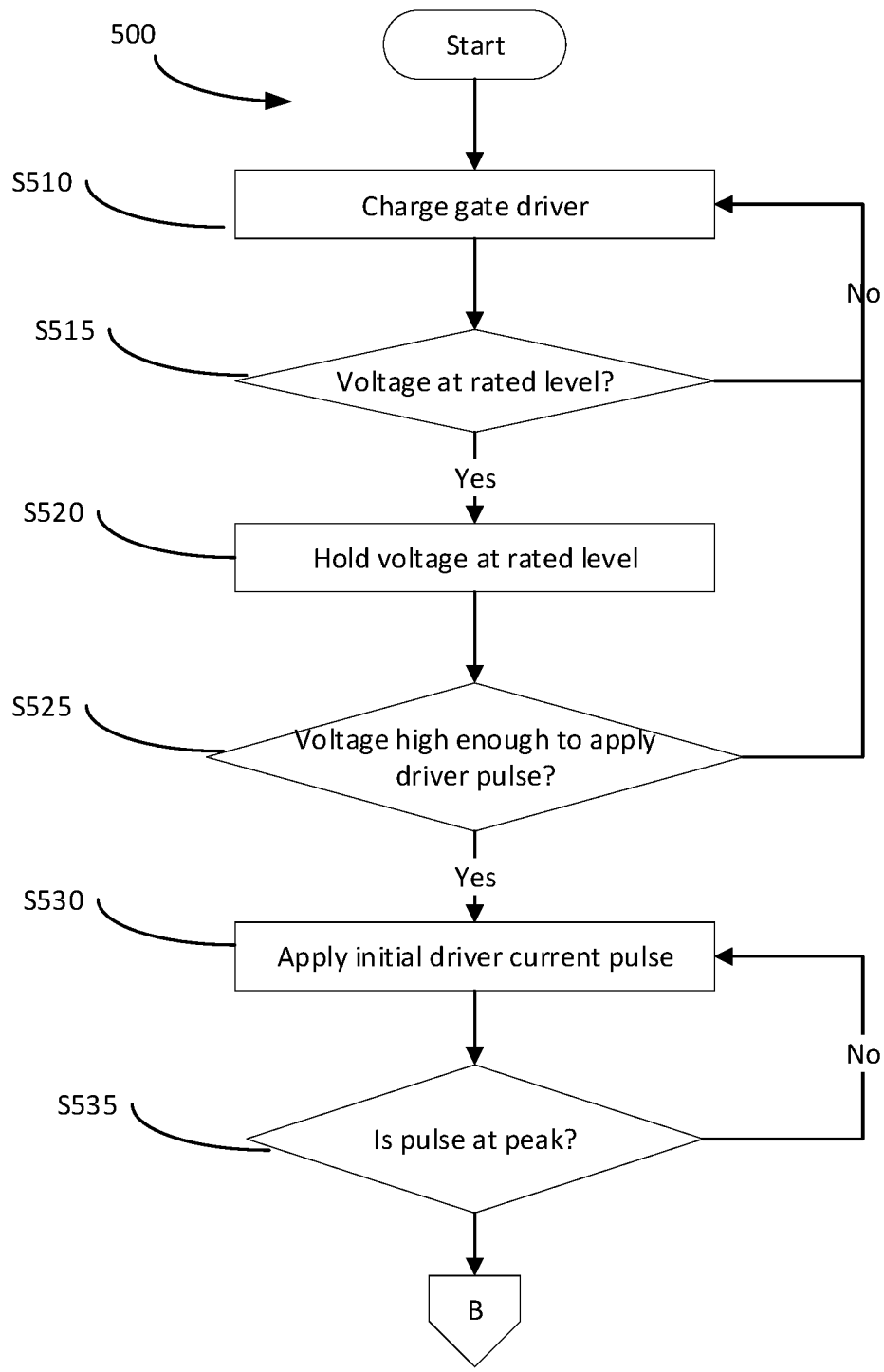
FIGS. 5A and 5B are a continuous exemplary flow chart and show a method for using thyristors to protect series-connected FACTS device from surge currents according to one embodiment.
Figure 5B:
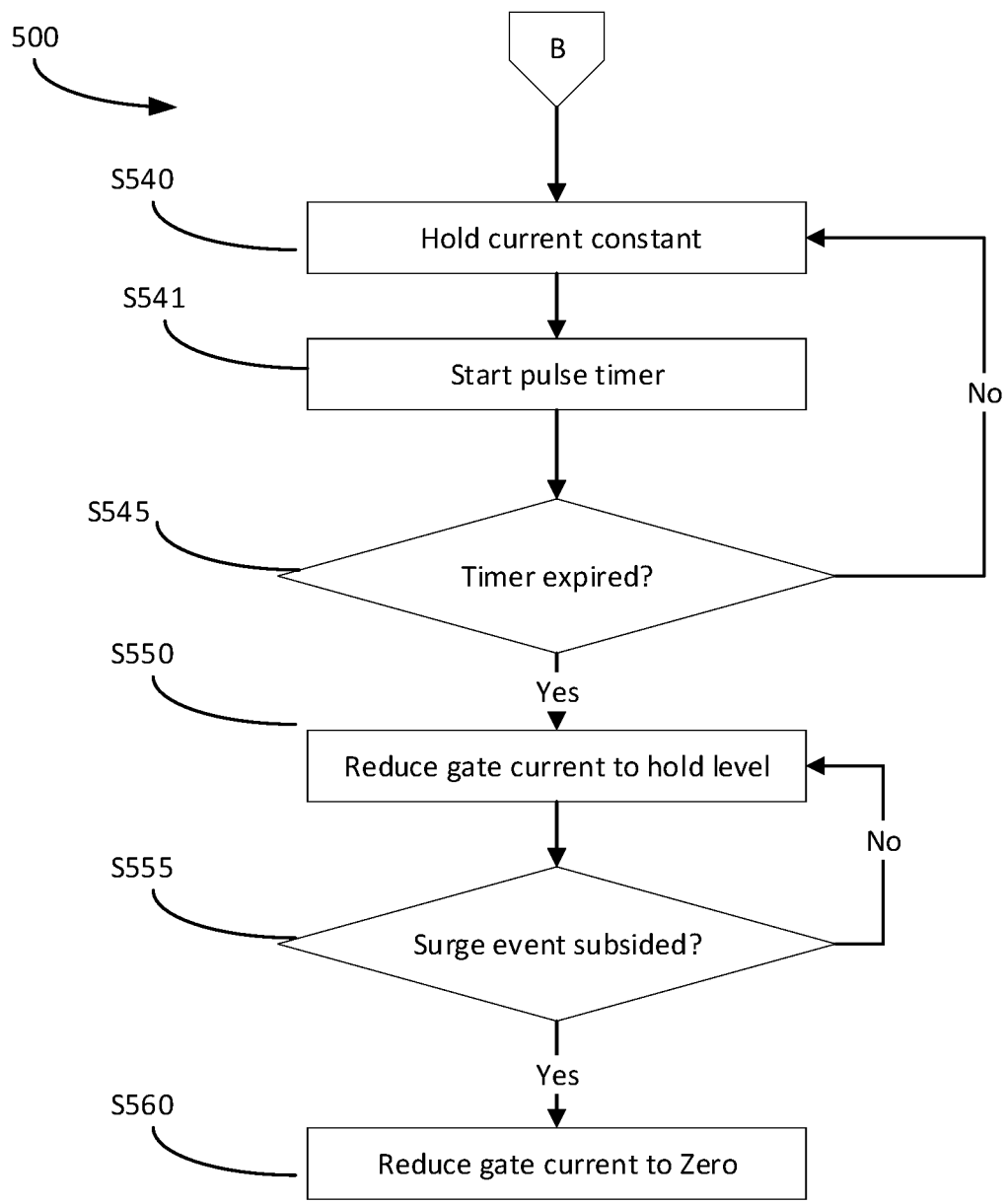

FIG. 5A and FIG. 5B illustrate a method for using thyristors to protect series-connected FACTS device from surge currents as per an embodiment. The method 500 starts at block S510 where the control 410 of system 400 determines that the device 130-01 is to be protected from a surge current and charges the thyristor 420's gate driver power supplies. The gate driver power supplies are charged until they reach specific rated levels (block S515) and the voltage is held at the rated levels (block S520). At block S525, the control block 410 determines if the voltage level of a gate driver power supply is sufficient to apply the driver pulse. In block S530, the control block 410 applies the initial current pulse to the gate of the thyristor 420. At block S535, the control block 410 determines if the applied current pulse is at peak value. Once the peak value is achieved the gate current is held constant (block S540) and a pulse timer is started (block S541). The control block 410 drives peak current pulse to the gate of the thyristor 420 until the pulse timer expires (block S545). Once the pulse timer expires, the control block 410 reduces the gate current to level just sufficient to keep the thyristor 420 turned on (block S550). The control block 410 keeps the thyristor 420 on until the surge is over (block S555). Once the surge event is over the control block 410 turns the gate current to zero to turn off the thyristor 420 (block S560).

The previous discussion focusses on protecting a series-connected FACTS device from fault surge currents during reclose attempts, it will be understood by those skilled in the art that the system and method can be used to protect other series-connected devices from surge currents.

Even though embodiments of the invention disclosed are described using specific implementation, it is intended only to be exemplary and non-limiting. The practitioners of the art will be able to understand and modify the same based on new innovations and concepts, as they are made available. The invention is intended to encompass these modifications.

Thus, the present disclosure has a number of aspects, which aspects may be practiced alone or in various combinations or sub-combinations, as desired. Also, while certain preferred embodiments of the present invention have been disclosed and described herein for purposes of exemplary illustration and not for purposes of limitation, it will be understood by those skilled in the art that various changes in form and detail may be made therein without departing from the spirit and scope of the disclosure.

What is claimed is:

1. A system to protect series-connected Flexible AC Transmission Systems (FACTS) devices, comprising:
   a thyristor connected in shunt with the FACTS device to be protected;
   control circuitry coupled to the thyristor to drive a gate of the thyristor with a direct current (DC) signal and turn on the thyristor in a time span on order of microseconds; and
   one or more sensors arranged to determine a temperature of the thyristor and an anode to cathode current of the thyristor.

2. The system to protect series-connected Flexible AC Transmission Systems (FACTS) devices of claim 1, further comprising a level shifter.

3. The system to protect series-connected Flexible AC Transmission Systems (FACTS) devices of claim 1, further comprising one or more drivers to drive the gate of the thyristor.

4. The system to protect series-connected Flexible AC Transmission Systems (FACTS) devices of claim 1, further comprising:
   a processor or circuit configured to determine voltage and current levels to be driven on the gate of the thyristor, based on the temperature of the thyristor and the anode to cathode current of the thyristor.

5. The system to protect series-connected Flexible AC Transmission Systems (FACTS) devices of claim 1, further comprising a communication module, operable to determine a surge current is imminent.

6. The system to protect series-connected Flexible AC Transmission Systems (FACTS) devices of claim 1, further comprising a power supply, to supply power to drive the gate of the thyristor.

7. A method to protect a series-connected Flexible AC Transmission Systems (FACTS) device, comprising:
   determining a surge current is imminent in an alternating current (AC) transmission line in a power grid;
   driving a gate of a thyristor that is connected in shunt with a FACTS device that is connected to the AC transmission line and is to be protected, with a direct current (DC) signal to turn on the thyristor in a time span on order of microseconds;
   determining a temperature of the thyristor, based on sensing with one or more sensors; and
   determining an anode to cathode current of the thyristor, based on sensing with the one or more sensors.

8. The method to protect a series-connected Flexible AC Transmission Systems (FACTS) device of claim 7, further comprising providing a voltage and current source to drive the gate of the thyristor, through a level shifter.

9. The method to protect a series-connected Flexible AC Transmission Systems (FACTS) device of claim 7, wherein the driving the gate of the thyristor is through one or more drivers.

10. The method to protect a series-connected Flexible AC Transmission Systems (FACTS) device of claim 7, further comprising:
    determining voltage and current levels to be driven on the gate of the thyristor, based on the temperature of the thyristor and based on the anode to cathode current of the thyristor.

11. The method to protect a series-connected Flexible AC Transmission Systems (FACTS) device of claim 7, further comprising:
    receiving a communication through a communication module, wherein the determining the surge current is imminent in the AC transmission line is based on the communication.

12. The method to protect a series-connected Flexible AC Transmission Systems (FACTS) device of claim 7, wherein the driving the gate of the thyristor comprises supplying power from a power supply to one or more drivers connected to the gate of the thyristor.

13. A method to drive a gate of a thyristor to protect a series-connected Flexible AC Transmission Systems (FACTS) device, comprising:
    determining the series-connected FACTS device is to be protected from a surge current on an alternating current (AC) transmission line in a power grid; and
    driving, with a plurality of peak current pulses, a gate of a thyristor that is connected in shunt with the FACTS device, to activate the thyristor in a time span on order of microseconds.

14. The method to drive a gate of a thyristor to protect a series-connected Flexible AC Transmission Systems (FACTS) device of claim 13, further comprising:
    charging a gate driver voltage until the gate driver voltage reaches a rated voltage to apply one of the peak current pulses.

15. The method to drive a gate of a thyristor to protect a series-connected Flexible AC Transmission Systems (FACTS) device of claim 14, further comprising:
    holding the gate driver voltage at the rated voltage.

16. The method to drive a gate of a thyristor to protect a series-connected Flexible AC Transmission Systems (FACTS) device of claim 13, wherein the driving with the plurality of peak current pulses comprises:
    driving an initial peak current pulse having amplitude of current pulse increased until the current pulse reaches a peak value.

17. The method to drive a gate of a thyristor to protect a series-connected Flexible AC Transmission Systems (FACTS) device of claim 13, wherein the driving with the plurality of peak current pulses comprises:

holding a peak value of one of the plurality of peak current pulses constant until a time passes per a gate driver requirement.

18. The method to drive a gate of a thyristor to protect a series-connected Flexible AC Transmission Systems (FACTS) device of claim 13, wherein the driving with the plurality of peak current pulses turns on the thyristor and protects the series-connected FACTS device.

19. The method to drive a gate of a thyristor to protect a series-connected Flexible AC Transmission Systems (FACTS) device of claim 13, further comprising:
 reducing a current level of one of the plurality of peak current pulses to a level to enable the gate of the thyristor until a surge event subsides.

* * * * *